(12) United States Patent
Sun et al.

(10) Patent No.: US 11,984,255 B2
(45) Date of Patent: May 14, 2024

(54) INTEGRATED MAGNETIC ELEMENT

(71) Applicant: Delta Electronics (Shanghai) Co., Ltd., Shanghai (CN)

(72) Inventors: Xiaoxia Sun, Shanghai (CN); Chunmei Wang, Shanghai (CN); Jun Sun, Shanghai (CN); Haijun Yang, Shanghai (CN); Zengyi Lu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 437 days.

(21) Appl. No.: 17/068,843

(22) Filed: Oct. 13, 2020

(65) Prior Publication Data

US 2021/0118610 A1   Apr. 22, 2021

(30) Foreign Application Priority Data

Oct. 16, 2019   (CN) .......................... 201910984697.3

(51) Int. Cl.
*H01F 27/28* (2006.01)
*G01R 15/18* (2006.01)
(Continued)

(52) U.S. Cl.
CPC ......... *H01F 27/402* (2013.01); *G01R 15/185* (2013.01); *H01F 27/02* (2013.01); *H01F 27/06* (2013.01); *H01F 27/24* (2013.01); *H01F 27/2823* (2013.01); *H01F 27/2847* (2013.01); *H01F 27/29* (2013.01); *H01F 27/325* (2013.01)

(58) Field of Classification Search
CPC ........ H01F 27/402; H01F 27/06; H01F 27/24; H01F 27/2823; H01F 27/2847; H01F 27/29; H01F 27/325; H01F 27/2828; H01F 27/2852; H01F 2027/065; H01F 2027/2857; H01F 27/38; H01F 38/30; H01F 27/427; H01F 38/28; H01F 38/34
See application file for complete search history.

(56) References Cited

U.S. PATENT DOCUMENTS 4,999,743 A * 3/1991 Fontana ................ H01F 27/402
336/174
8,013,709 B2 * 9/2011 Tsai ...................... H01F 27/2847
336/119
(Continued)

FOREIGN PATENT DOCUMENTS

CN         1988071 A     6/2007
CN       101615496 A    12/2009
(Continued)

*Primary Examiner* — Mang Tin Bik Lian
(74) *Attorney, Agent, or Firm* — CKC & Partners Co., LLC

(57) ABSTRACT

An integrated magnetic element includes an accommodating part; a current sensor disposed on the accommodating part; and a transformer disposed on the accommodating part. The transformer includes a magnetic core, a first winding including a plurality of wires, and a second winding, wherein some of the plurality of wires passes through the current sensor to shunt and detect current flowing through the first winding, and current values of the wires are detected by the current sensor to obtain a total current value of the first winding of the transformer according to a shunt ratio by the winding construction of the preset transformer.

13 Claims, 8 Drawing Sheets

(51) Int. Cl.
*H01F 27/02* (2006.01)
*H01F 27/06* (2006.01)
*H01F 27/24* (2006.01)
*H01F 27/29* (2006.01)
*H01F 27/32* (2006.01)
*H01F 27/40* (2006.01)

(56) References Cited

U.S. PATENT DOCUMENTS

| | | | | |
|---|---|---|---|---|
| 2007/0115700 | A1* | 5/2007 | Springett | H02M 3/33592 363/24 |
| 2009/0315661 | A1* | 12/2009 | Teng | H01F 27/402 336/192 |
| 2011/0260824 | A1* | 10/2011 | Fornage | H01F 38/30 29/606 |
| 2012/0218793 | A1* | 8/2012 | Springett | H02M 3/33592 363/89 |
| 2013/0027173 | A1* | 1/2013 | Ohsawa | H01F 27/306 336/220 |
| 2015/0318098 | A1* | 11/2015 | Miyamoto | H01F 30/00 336/183 |
| 2018/0068782 | A1* | 3/2018 | Afsharian | H01F 27/29 |
| 2019/0311846 | A1* | 10/2019 | Ren | H01F 27/306 |

FOREIGN PATENT DOCUMENTS

| | | |
|---|---|---|
| CN | 101615496 B | 8/2012 |
| CN | 103675401 A | 3/2014 |
| CN | 102033152 B | 10/2015 |
| CN | 105226916 A | 1/2016 |
| CN | 110086322 A | 8/2019 |
| JP | H0956164 A | 2/1997 |

\* cited by examiner

INTEGRATED MAGNETIC ELEMENT

CROSS-REFERENCE TO RELATED APPLICATIONS

This non-provisional application claims priority under 35 U.S.C. § 119(a) on Patent Application No. 201910984697.3 filed in P.R. China on Oct. 16, 2019, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

BACKGROUND OF THE INVENTION

1. Field of the Invention

The invention relates to a magnetic element, and specifically to an integrated magnetic element that integrates a current sensor and a transformer into one part.

2. Related Art

As electronic devices being more convenient and multi-functional, passive elements, especially magnetic elements, are required to be miniaturized and more economical, which urges extensive development of integrated magnetic elements. The existing integrated magnetic elements have windings with single winding method, and the volume of the magnetic elements including the current sensor are usually large. With the increase of the power of the converter, deficiencies of large size and heavy weight become more obvious. Therefore, there is an urgent need to develop an integrated magnetic element that overcomes the above deficiencies.

SUMMARY OF THE INVENTION

The technical problem to be solved by the invention is to provide an integrated magnetic element, comprising:
an accommodating part;
a current sensor disposed on the accommodating part; and
a transformer disposed on the accommodating part, the transformer comprising an magnetic core, a first winding including a plurality of wires, and a second winding, wherein a part of the plurality of wires passes through the current sensor to shunt and detect current flowing through the first winding, and current values of the wires are detected by the current sensor to obtain a total current value of the first winding of the transformer according to a shunt ratio (obtaining a controllable shunt ratio through the winding structure of a preset transformer, hereinafter refer to the same).

The invention further provides an integrated magnetic element, comprising:
a base;
a current sensor disposed on the base; and
a transformer provided on the base through which the current sensor and the transformer are integrated into one part, the transformer comprising an magnetic core, a first winding including at least one wire, and a second winding, wherein a part of sections of the one wire of the first winding passes through the current sensor, and current values of the part of sections of the wires are detected by the current sensor to obtain a total current value of the first winding of the transformer.

DETAILED EMBODIMENTS OF THE INVENTION

Hereinafter the invention is further described in detail with reference to the accompanying drawings and the specific embodiments. The embodiments are implemented on the premise of the technical solution of the invention, where embodiments and operation process are given, but the protection scope of the invention is not limited thereto.

Figure 1A:
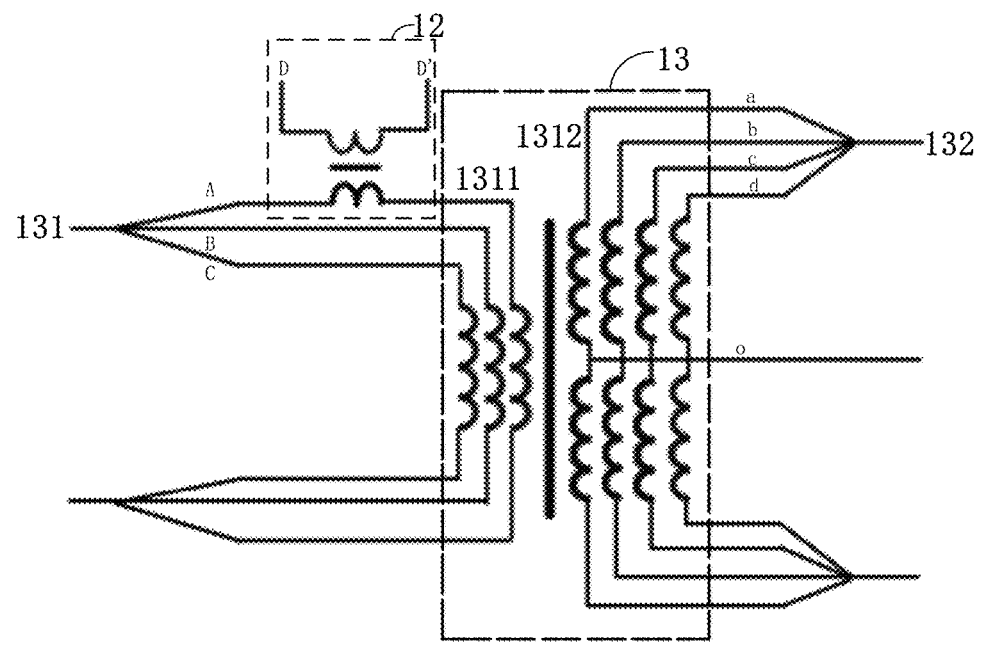
FIG. 1a is a schematic circuit diagram of an integrated magnetic element according to a first embodiment of the invention.
Figure 1B:
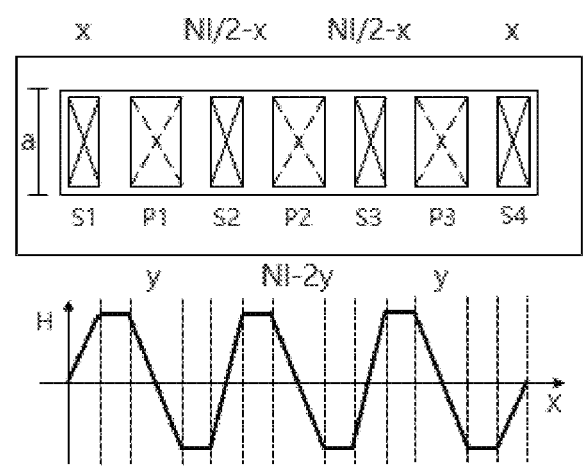
FIG. 1b is an analysis diagram of a magnetic field and a current distribution ratio of the integrated magnetic element according to the first embodiment of the invention.
Figure 2:
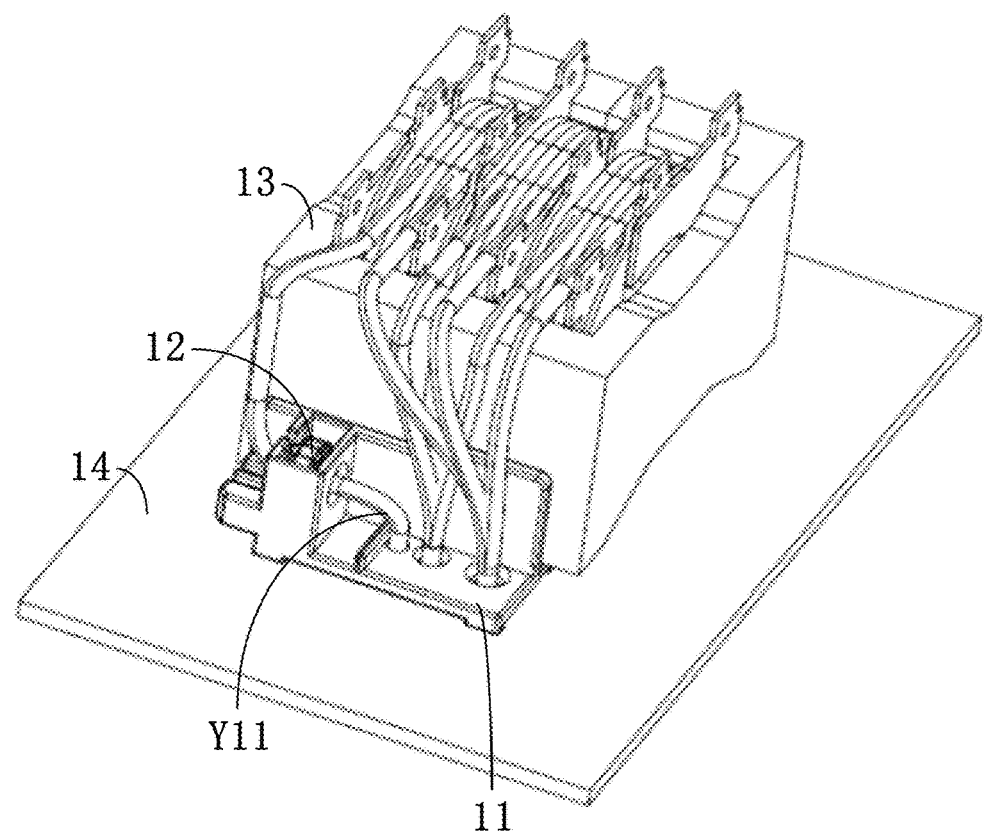
FIG. 2 is a structural diagram of the integrated magnetic element according to the first embodiment of the invention.
Figure 3:
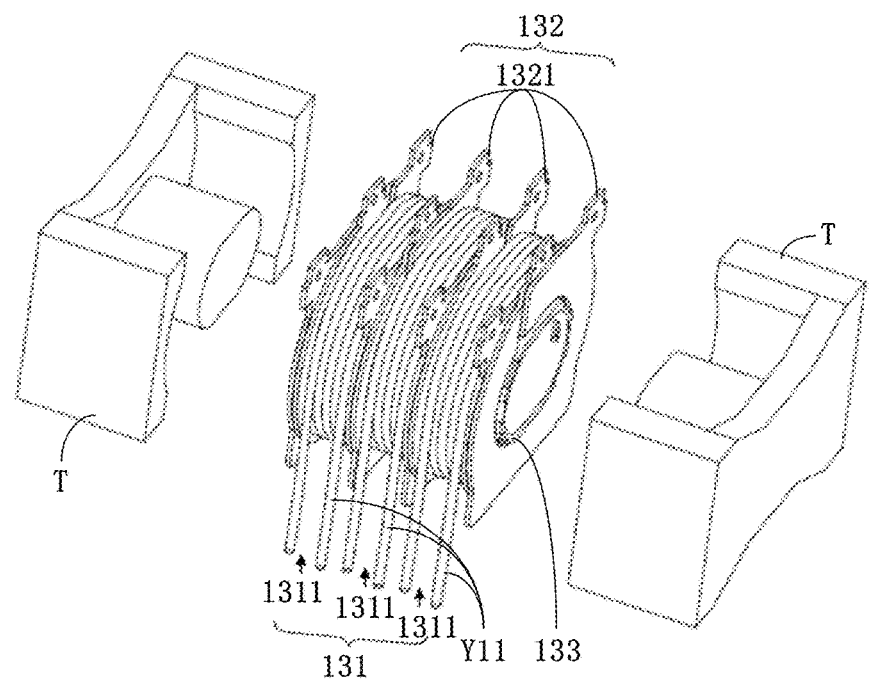
FIG. 3 is a structural diagram of a transformer in FIG. 2.
Figure 4:
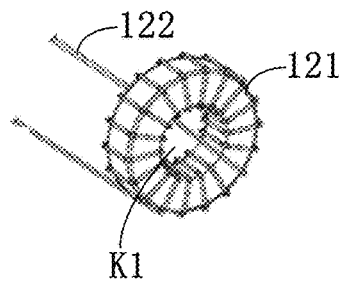
FIG. 4 is a structural diagram of a current sensor in FIG. 2.
Figure 5:
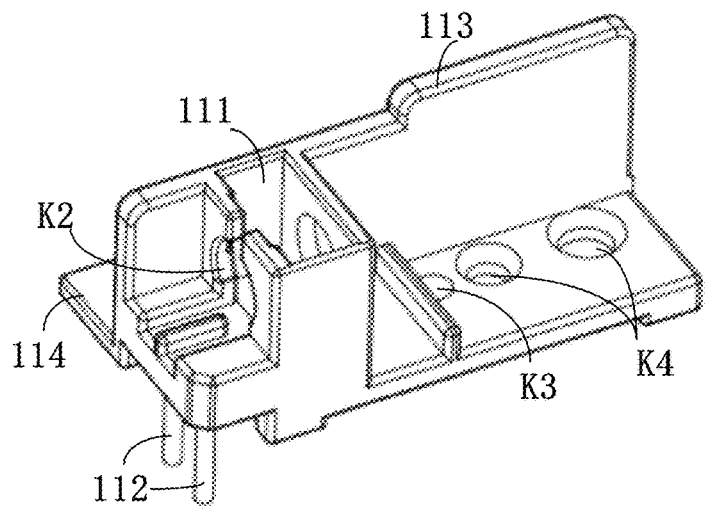
FIG. 5 is a structural diagram of an accommodating part in FIG. 2.
Figure 6:
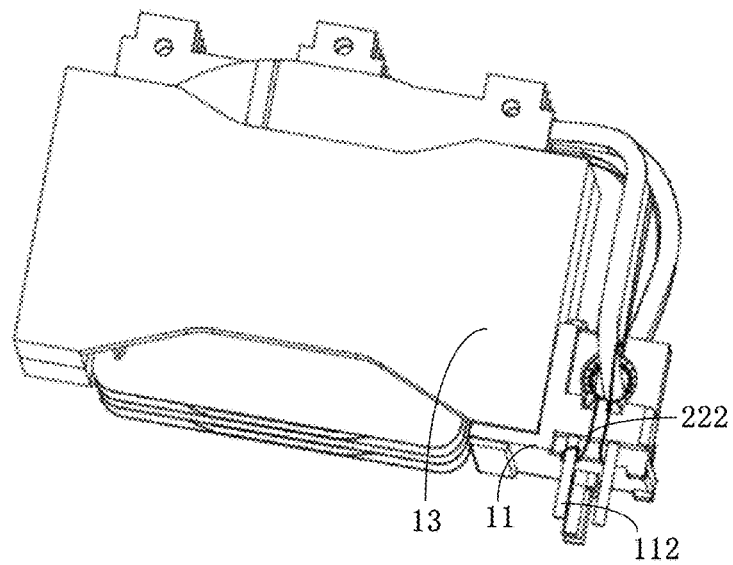
FIG. 6 is a structural diagram of another viewing angle of the integrated magnetic element in FIG. 2.

Please refer to FIGS. 1a-6, FIG. 1a is a schematic circuit diagram of an integrated magnetic element according to a first embodiment of the invention; FIG. 1b is an analysis diagram of a magnetic field and a current distribution ratio of the integrated magnetic element according to the first embodiment of the invention; FIG. 2 is a structural diagram of the integrated magnetic element according to the first embodiment of the invention; FIG. 3 is a structural diagram of a transformer in FIG. 2; FIG. 4 is a structural diagram of a current sensor in FIG. 2; FIG. 5 is a structural diagram of an accommodating part in FIG. 2; FIG. 6 is a structural diagram of another viewing angle of the integrated magnetic element in FIG. 2.

As shown in FIGS. 2-6, the integrated magnetic element of the invention includes an accommodating part 11, a current sensor 12 disposed inside the accommodating part 11, and a transformer 13 disposed on the accommodating part 11. The transformer 13 comprises a magnetic core T, a first winding 131 and a second winding 132. The first winding 131 includes a plurality of wires Y11, and a current flowing through the first winding is a sum of currents flowing through the plurality of wires Y11. Referring to FIGS. 1a-6, the first winding 131 includes a plurality of sub-windings 1311 connected in parallel, and the second winding 132 includes a plurality of sub-windings 1321 connected in parallel. Each of the sub-windings 1311 includes one wire Y11. The current sensor 12 is provided associating with one or a part of the plurality of wires Y11 to detect the current value of one or a part of the plurality of wires Y11 and then to obtain the total current of the first winding 131 according to a shunt ratio and the current value of one or a part of the plurality of wires Y11.

In this embodiment, taking the first winding 131 as a primary winding including three primary sub-windings P1, P2, P3 connected in parallel, and the second winding 132 as a secondary winding including four secondary sub-windings S1, S2, S3, S4 connected in parallel for example. Arrangement of the sub-windings is S1-P1-S2-P2-S3-P3-S4 by arranging a layout of the primary and secondary sub-windings along an axial direction, as shown in FIG. 1b. Formulas (1)-(5) are specific analyses with reference to FIG. 1b.

$$I_p(y, NI) = \begin{pmatrix} y \\ NI - 2y \\ y \end{pmatrix} \quad \text{Formula (1)}$$

$$I_s(x, NI) = \begin{pmatrix} x \\ \frac{NI}{2} - x \\ \frac{NI}{2} - x \\ x \end{pmatrix}$$

$$H_0(x, y, NI, a) = 0 \quad \text{Formula (2)}$$

$$H_1(x, y, NI, a) = \frac{I_s(x, NI)_0}{a}$$

$$H_2(x, y, NI, a) = H_1(x, y, NI, a) - \frac{I_p(y, NI)_0}{a}$$

$$H_3(x, y, NI, a) = H_2(x, y, NI, a) + \frac{I_s(x, NI)_1}{a}$$

$$H_4(x, y, NI, a) = H_3(x, y, NI, a) - \frac{I_p(y, NI)_1}{a}$$

$$H_5(x, y, NI, a) = H_4(x, y, NI, a) + \frac{I_s(x, NI)_2}{a}$$

$$H_6(x, y, NI, a) = H_5(x, y, NI, a) - \frac{I_p(x, NI)_2}{a}$$

$$H_7(x, y, NI, a) = 0$$

$$HH(x, y, NI, a) = \begin{pmatrix} H_0(x, y, NI, a) \\ H_1(x, y, NI, a) \\ H_2(x, y, NI, a) \\ H_3(x, y, NI, a) \\ H_4(x, y, NI, a) \\ H_5(x, y, NI, a) \\ H_6(x, y, NI, a) \\ H_7(x, y, NI, a) \end{pmatrix} = \begin{pmatrix} 0 \\ \frac{x}{a} \\ \frac{x-y}{a} \\ \frac{NI-2y}{2a} \\ -\frac{NI-2y}{a} \\ -\frac{x-y}{a} \\ -\frac{x}{a} \\ 0 \end{pmatrix} \quad \text{Formula (3)}$$

$$f(x, y, NI, a) = \sum_{i=0}^{\text{rows}(HH(x,y,NI,a))-1} (HH(x, y, NI, a)_i)^2 = \quad \text{Formula (4)}$$

$$\frac{NI^2 - 4 \cdot NI \cdot y + 8 \cdot x^2 - 8 \cdot x \cdot y + 8 \cdot y^2}{2 \cdot a^2}$$

$$\begin{pmatrix} \frac{\partial}{\partial x} f(x, y, NI, a) = 0 \\ \frac{\partial}{\partial y} f(x, y, NI, a) = 0 \end{pmatrix} \rightarrow \begin{pmatrix} x \\ y \end{pmatrix} = \begin{pmatrix} \frac{NI}{6} \\ \frac{NI}{3} \end{pmatrix} \quad \text{Formula (5)}$$

$$\begin{pmatrix} \frac{\partial^2}{\partial x^2} f(x, y, NI, a) \\ \frac{\partial^2}{\partial y^2} f(x, y, NI, a) \end{pmatrix} \rightarrow \begin{pmatrix} \frac{8}{a^2} \\ \frac{8}{a^2} \end{pmatrix} > 0$$

Wherein NI represents a total magnet-motive force of primary side or secondary side, x represents a magnet-motive force of the secondary winding in first and seventh winding slots, y represents a magnet-motive force of the primary winding in second and six winding slots, $I_p(y, NI)$ is a magnetic field intensity at respective points of the primary winding slot, and $I_s(x, NI)$ is a magnetic field intensity at respective points of the secondary winding slot; a represents a width of the winding slot (i.e., a distance from a middle column to a side column of the magnetic core of the transformer), $H_0(x, y, NI, a)$ to $H_7(x, y, NI, a)$ are magnetic field intensities in the winding slots and the non-winding slots; HH(x, y, NI, a) represents a magnetic field intensity at respective points starting from S1 (or S4) to S4 (or S1), f(x, y, NI, a) is a sum of squares of the magnetic field intensities in respective slots, and f(x, y, NI, a)∝HH (x, y, NI, a)² represents an equivalent coefficient related to energy of magnetic field of the transformer.

In formula (5), according to the energy minimization principle in a steady-state, it can be known that when a first derivative is equal to zero, the value is an extremum value of the function, and when a second derivative is greater than zero, the value is a minimum point. Accordingly, it is known that a current distribution ratio of the sub-windings of the three primary windings is 1:1:1, and a current distribution ratio of the sub-windings of the four secondary windings is 1:2:2:1 from formula 5 and formula 1.

Therefore, the current flowing through the part of the wires Y11 and a total current flowing through the first winding 131 have a fixed shunt ratio, such as 1/3, so a total current value of the first winding 131 of the transformer 13 can be obtained according to the fixed shunt ratio and the current value of the part of the wires detected by the current sensor 12. In this embodiment, the first winding 131 is the primary winding, and the second winding 132 is the secondary winding, but the invention is not limited thereto. In other embodiments, the first winding 131 also may be the secondary winding, and the second winding 132 also may be the primary winding.

Further, the current sensor 12 comprises a first magnetic core 121, and coils 122 winded onto the first magnetic core 121, and the first magnetic core 121 has a central hole K1 through which the part of the wires Y11 of the first winding 131 passes.

As shown in FIG. 3, the transformer 13 comprises two magnetic cores T, the first winding 131 and the second winding 132. The first winding 131 includes a plurality of sub-windings 1311 connected in parallel, and the second winding 132 includes a plurality of sub-windings 1321 connected in parallel. The plurality of sub-windings 1311 is winded onto a bobbin 133, each including one wire Y11, and in this embodiment, the wire Y11 of one sub-winding 1311 passes through the central hole K1, but the invention is not limited thereto. In other embodiments, the first winding also may include at least one sub-winding, each including a plurality of wires Y11, and one terminal of the part of the plurality of wires Y11 passes through the central hole K1. Besides, the sub-windings 1311 are copper wire windings, but the invention is not limited thereto.

It shall be noted that in this embodiment, the first winding 131 is a primary winding and comprises three sub-windings 1311, and the second winding 132 is a secondary winding and comprises four sub-windings 1321. The three sub-windings 1311 are interleaving arranged with the four sub-windings 1321 to form a structure of "secondary-primary-secondary-primary-secondary-primary-secondary", but the invention is not limited thereto. In other embodiments, the first winding can be the secondary winding, the second winding can be the primary winding, and the three sub-windings of the first winding are interleaving arranged with the four sub-windings of the second winding to form a structure of "primary-secondary-primary-secondary-primary-secondary-primary". In another embodiments, the number of the sub-windings of the first winding 131 and the second winding 132 is not limited to three or four respectively, for example, the first winding may include two sub-windings 1311, the second winding may include three sub-windings 1321, and the two sub-windings 1311 are interleaving arranged with the three sub-windings 1321 to form a structure of "secondary-primary-secondary-primary-secondary" or "primary-secondary-primary-secondary-primary". The invention does not limit the number of sub-windings, only if the sub-windings formed at both ends are windings in the same form. That is, both are primary sub-windings or secondary sub-windings. For example, the structure can be "primary-secondary-primary- . . . -primary" or "secondary-primary-secondary-. . . -secondary".

According to the analysis with reference to FIG. 1b, current automatic equalization or current shunting with a fixed shunt ratio among the respective sub-windings 1311 can be realized by the interleaved arrangement of the primary and secondary windings.

It shall be noticed that the invention does not limit the winding way of the windings, and the designer may select the corresponding winding way according to actual situations, only if the above structure is formed.

Still further, the accommodating part 11 includes a mounting groove 111 and two first terminals 112. The mounting groove 111 has a through-hole K2 aligned with the central hole K1, the current sensor 12 is provided within the mounting groove 111, both ends of the coils 122 are electrically connected to the two first terminals 112 correspondingly, and the part of the wires Y11 of the first winding 131 passes through the through-hole K2 and the central hole K1.

Even further, the accommodating part 11 further includes a side retaining wall 113, a first mounting hole K3, and a second mounting hole K4, and the side retaining wall 113 is between the current sensor 12 and the transformer 13, and fixedly connected to the transformer 13. The wires Y11 passing through the central hole K1 are fixed within the first mounting hole K3, and the remaining wires can be fixed within the second mounting hole K4.

Both ends of the coils 122 are hanged on the two first terminals 112 respectively to be in connected with a PCB board 14, while the first lead wire Y11 passes through the central hole K1 to detect the current flowing through the wire Y11 through the current sensor 12, and then is fixed within the first mounting hole K3, and other wires are fixed within the second mounting hole K4, and in connected with the PCB board 14. Meanwhile, the transformer 13 is also provided on one side surface of the accommodating part 11. In this embodiment, the accommodating part 11 further has a bottom retaining wall 114, and the transformer and the current sensor form an integrated magnetic element insertable onto the PCB board 14 by aligning the magnetic cores T of the transformer 13 with the side retaining wall 113 and the bottom retaining wall 114, so as to be electrically connected to the PCB board 14.

Besides, the wire Y11 passing through the central hole K1 of the current sensor 12 can be one or parts of the wires of the first winding. The current sensor 12 detects the current value of one or a part of the plurality of wires Y11 and then to obtain the total current of the first winding 131 according to the fixed shunt ratio and the current value of one or a part of the plurality of wires Y11.

Accordingly, the invention solves the problem of long-distance fly wires of the magnetic element, and can reduce loss brought by long fly wires; the retaining walls solve the problem of safe distance, and save space of the magnetic element; parallel connection of the plurality of primary windings can realize input of high power, while detecting using a shunt ratio can minimize an overall volume of the magnetic element.

Figure 7:
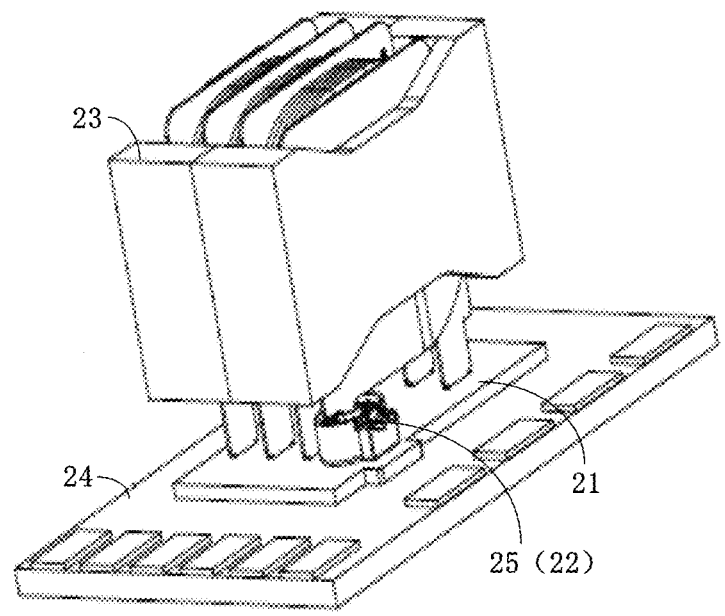
FIG. 7 is a structural diagram of an integrated magnetic element according to a second embodiment of the invention.
Figure 8:
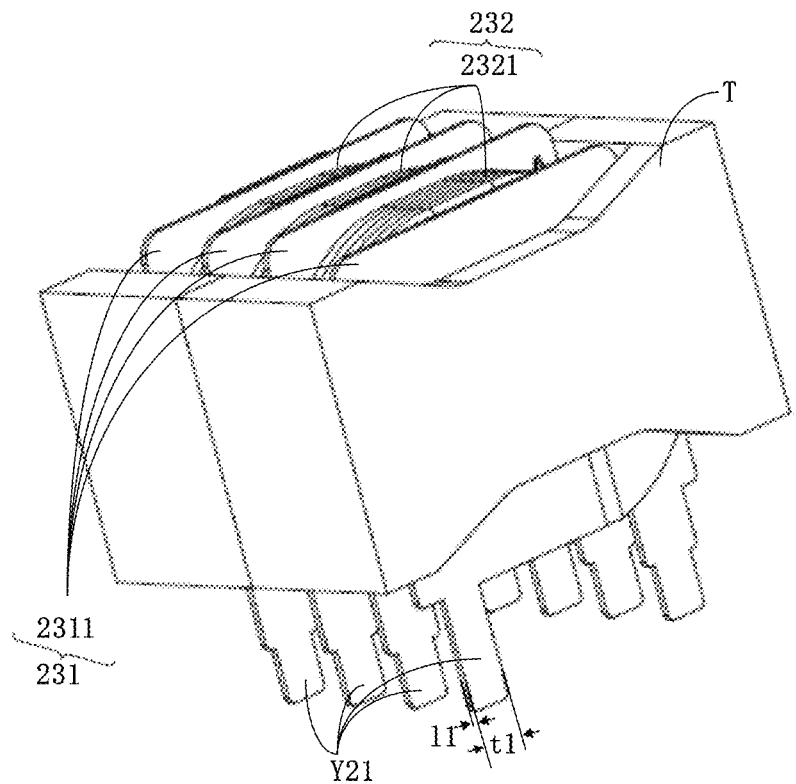
FIG. 8 is a structural diagram of a transformer in FIG. 7.
Figure 9:
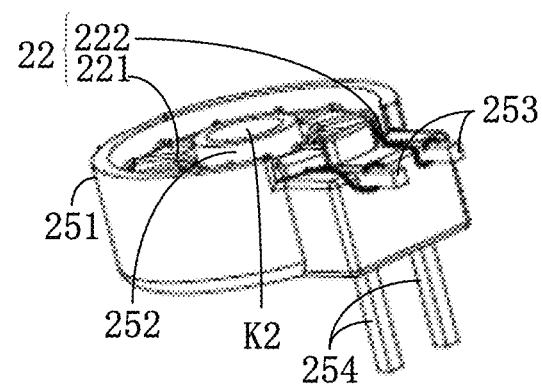
FIG. 9 is a structural diagram of the assembly of a current sensor and a sleeve cover in FIG. 7.

Referring to FIGS. 7-9, FIG. 7 is a structural diagram of an integrated magnetic element according to a second embodiment of the invention; FIG. 8 is a structural diagram of a transformer in FIG. 7; FIG. 9 is a structural diagram of the assembly of a current sensor and a sleeve cover in FIG. 7.

As shown in FIGS. 7-9, the integrated magnetic element comprises a base 21; a current sensor 22 disposed on the base 21; a transformer 23 provided on the base 21 through which the current sensor 22 and the transformer 23 are integrated into one part. The transformer 23 comprises a magnetic core T, a first winding 231, and a second winding 232. The arrangement between the first winding and the second winding in FIGS. 7-9 is substantially the same as FIGS. 2-6, and the details are not described here. In this embodiment, the first winding 231 is a secondary winding, and the second winding 232 is a primary winding, but the invention is not limited thereto. In other embodiments, the first winding 231 also may be the primary winding, and the second winding 232 also may be the secondary winding.

The transformer 23 comprises two magnetic cores T and a plurality of sub-windings 2321 of the second winging 232, the first winding 231 includes a plurality of sub-windings 2311 connected in parallel, each including at least one wire Y21, for example, two wires Y21. In this embodiment, one of the two wires Y21 of the sub-windings 2311 passes through a central hole K1, but the invention is not limited thereto. In other embodiments, the first winding further may include at least one sub-winding, each including a plurality of wires Y21, wherein one of the two wires Y21 of the sub-windings 2311 passes through a central hole K1. Besides, the sub-windings 2311 are copper sheet windings, but the invention is not limited thereto.

Further, the current sensor 22 comprises a first magnetic core 221, and coils 222 winded onto the first magnetic core 221, and the first magnetic core 221 has a central hole K1 through which any of the wires Y21 of the first winding 231 passes. Therefore, the current value of the wires Y21 are detected by the current sensor 22 and a total current value of the first winding 231 of the transformer 23 is obtained according to the above current value and the fixed shunt ratio.

Still further, the integrated magnetic element further includes a sleeve cover 25 disposed on the base 21, and including a protective retaining wall 251, a middle part 252, a through-hole K2, and two first terminals 253. The protective retaining wall 251 surrounds the middle part 252 and the through-hole K2, the two first terminals 253 are provided on an outer side of the protective retaining wall 251, the current sensor 22 is placed within the sleeve cover 25, the first magnetic core 221 is fitted onto the middle part 252, the central hole K1 of the first magnetic core 221 is aligned with the through-hole K2, both ends of the coils 222 are electrically connected to the two first terminals 253 correspondingly (terminal signals 253 and 254 are two ends of the same L-shaped terminal, hereinafter refer to the same), and any of the wires Y21 is fixed onto the base 21 after passing through the through-hole K2 and the central hole K1.

Still further, a bottom of the sleeve cover 25 is also provided with a first fixing terminal 254, and the first fixing terminal 254 is disposed on the base 21 to fix the sleeve cover 25 onto the base 21.

The current sensor 22 is aligned with the through-hole K2 through the central hole K1 to fit the current sensor 22 onto the middle part 252, and both ends of the coils 222 are connected on the two first terminals 253, respectively. The wire Y21 of the secondary copper sheet winding passes through the central hole K1 to be fixed onto the base 21, and other copper sheet wires are directly fixed onto the base 21.

Accordingly, the invention inserts an integrated magnetic element formed by the transformer, and the current sensor onto the PCB board by fixing the secondary copper sheets and the first terminals of the transformer onto the base, so as to realize the electrical connection with the PCB board.

Figure 10:
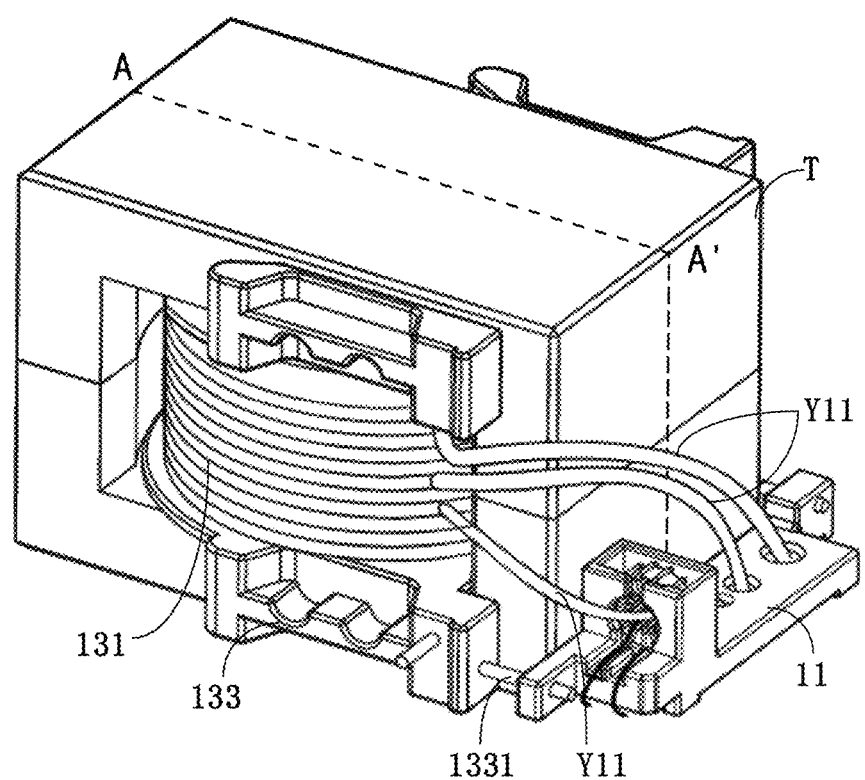
FIG. 10 is a structural diagram of an integrated magnetic element according to a third embodiment of the invention.

Referring to FIG. 10, FIG. 10 is a structural diagram of an integrated magnetic element according to a third embodiment of the invention. The schematic circuit diagram and structural diagram of the integrated magnetic element illustrated in FIG. 10 are substantially the same as FIGS. 1a and 2, and the details are not described here. In this embodiment, the difference is that the winding arrangement of FIG. 10 can be arranged radially. Moreover, the bobbin 133 is provided with a second fixing terminal 1331, and the second fixing terminal 1331 connects and fixes the transformer 13 and the accommodating part 11.

Figure 11:
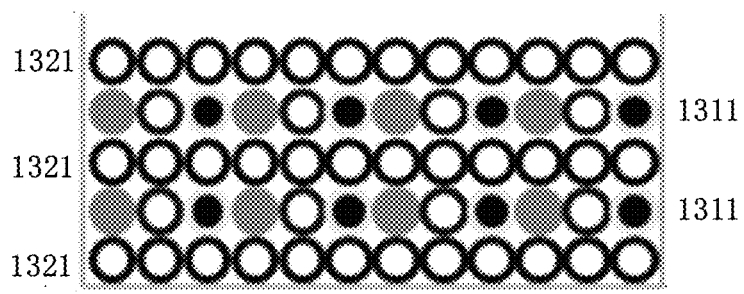
FIG. 11 is a schematic diagram (sectional view) of a winding along a cross-section A-A' in FIG. 10.
Figure 12:
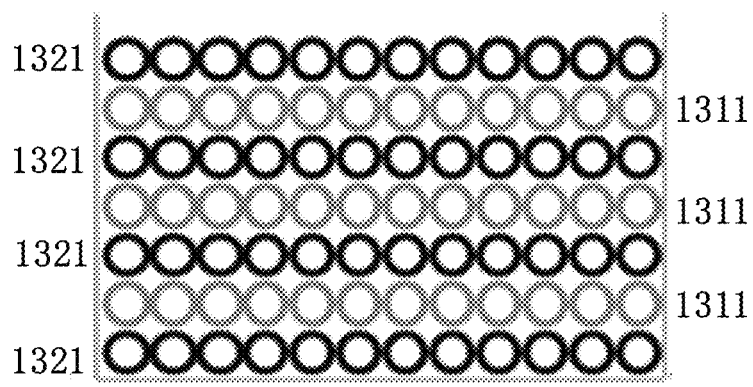
FIG. 12 is a schematic diagram of the other winding along the cross-section A-A' in FIG. 10.
Figure 13:
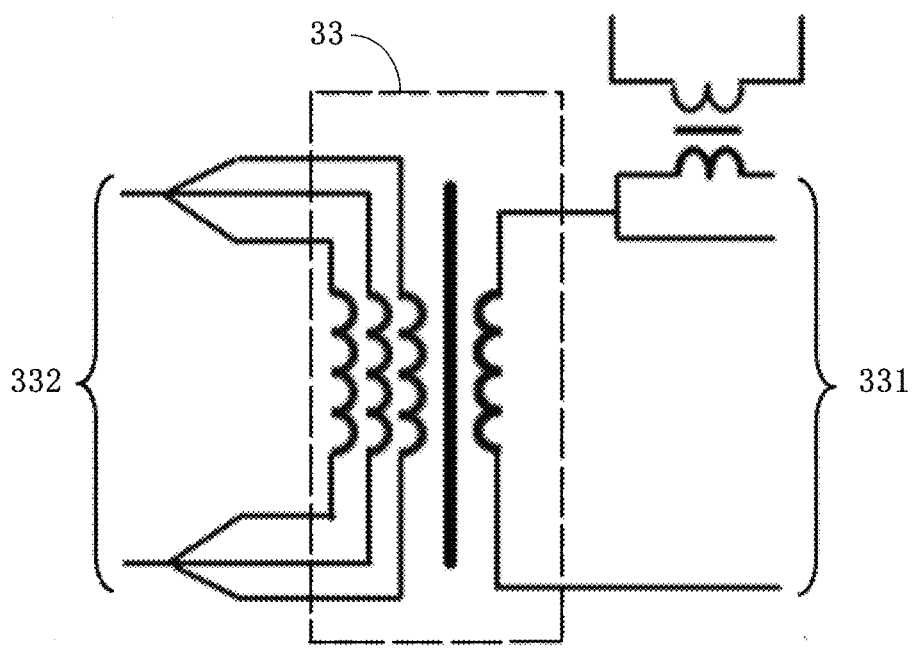
FIG. 13 is a schematic circuit diagram of an integrated magnetic element according to a fourth embodiment of the invention.

FIGS. 11 and 12 are arrangement diagrams of windings along a cross-section A-A' of the integrated magnetic element in FIG. 10 according to different embodiments. In FIG. 11, the structure of the integrated magnetic element in FIG. 10 may refer to FIGS. 1-6. The windings of the transformer are distributed that the second and fourth layer from bottom to top is sub-windings of the primary winding respectively, and the first, third and fifth layer is sub-windings of the secondary winding respectively. Otherwise, the second and fourth layer is sub-windings of the secondary winding respectively, and the first, third and fifth layer is sub-windings of the primary winding respectively. The sub-windings of the second layer are three parallel winded wires, the sub-windings of the fourth layer are also three parallel winded wires, and the sub-windings of the second and fourth layers can be connected in parallel or series. As the magnetic field being in the horizontal direction in such an arrangement of the windings, the magnetic fields where the three parallel winded sub-windings of the second and fourth layers are located have the same magnetic field environment, so the three parallel winded sub-windings equalize current automatically. Meanwhile, the windings of the first, third, and fifth layers also can be connected in series or parallel, and a current distribution ratio of the sub-windings of the first, third, and fifth layers is 1:2:1 in the case of parallel connection. Therefore, the fixed shunt ratio is realized.

As shown in FIG. 12, the structure of the integrated magnetic element in FIG. 10 may refer to FIGS. 1-6. The windings of the integrated magnetic element are distributed that the second, fourth, and sixth layers from bottom to top is sub-windings of the primary winding, and the first, third, fifth, and seventh layers is sub-windings of the secondary winding, or otherwise. Since the structure is the same as analyses of FIG. 1b, in the case that the windings of the second, fourth, and sixth layers are connected in parallel, a current distribution ratio of the sub-windings of the second, fourth, and sixth layers is 1:1:1, and a current distribution ratio of the sub-windings of the first, third, fifth, and seventh layers is 1:2:2:1. Therefore, the fixed shunt ratio is realized.

The number of the sub-windings corresponding to the primary winding and the secondary winding is not limited thereto. The first winding may include N number of sub-windings connected in series or in parallel, the second winding may include N+1 number of sub-windings connected in series or in parallel, where N is a positive integer greater than or equal to 2, and the N sub-windings of the first winding are interleaving arranged with the N+1 sub-windings of the second winding. Moreover, layers of the windings of the transformer are 2N+1, wherein even-numbered layers are sub-windings corresponding to the first winding, and odd-numbered layers are sub-windings corresponding to the second winding. Alternatively, the sub-windings corresponding to the first winding are formed by parallel winding of a plurality of wires.

By means of the above winding way, the windings of the transformer may automatically form current equalization without additional control circuit or method, and the circuit of the integrated magnetic element is simple.

Figure 14:
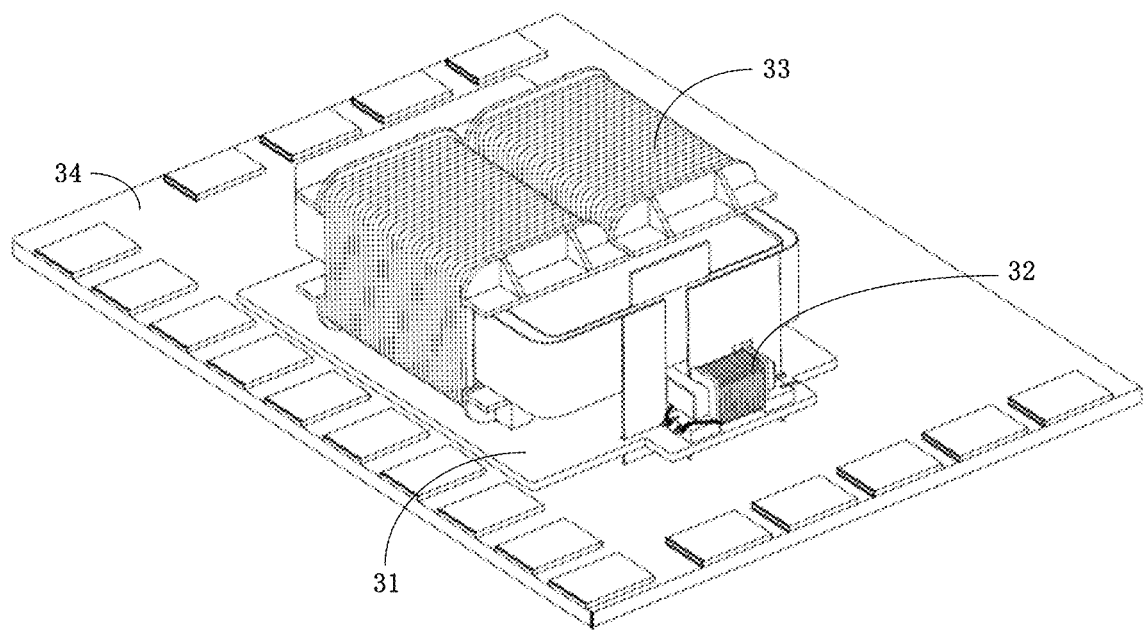
FIG. 14 is a structural diagram of the integrated magnetic element according to the fourth embodiment of the invention.
Figure 15:
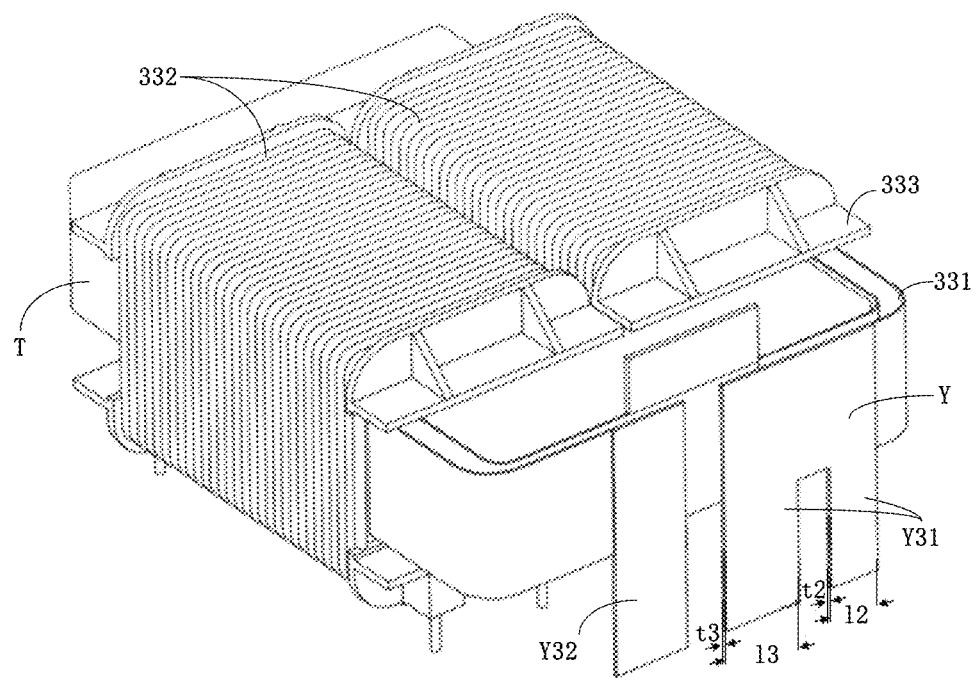
FIG. 15 is a structural diagram of a transformer in FIG. 14.
Figure 16:
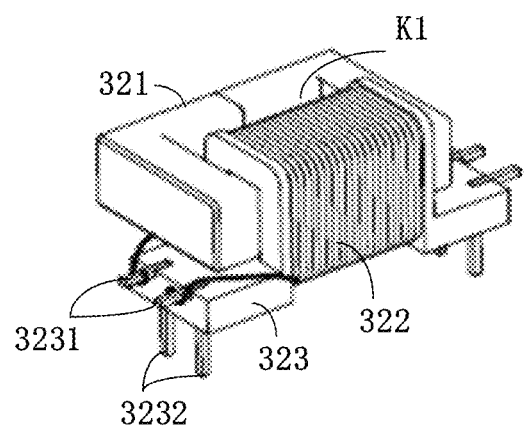
FIG. 16 is a structural diagram of a current sensor in FIG. 14.

Referring to FIGS. 13-16, FIG. 13 is a schematic circuit diagram of an integrated magnetic element according to a fourth embodiment of the invention; FIG. 14 is a structural diagram of the integrated magnetic element according to the fourth embodiment of the invention; FIG. 15 is a structural diagram of a transformer in FIG. 14; FIG. 16 is a structural diagram of a current sensor in FIG. 14.

Referring to FIGS. 14-16, in this embodiment, the transformer 33 further comprises a magnetic core T, a plurality of second windings (i.e., primary windings) 332 and a bobbin 333, a first winding 331 (i.e., secondary winding) is a copper coil winding. The arrangement between the first winding and the second winding in FIGS. 14-16 is substantially the same as FIGS. 1-13, and the details are not described here. The first winding 331 includes two first wires Y31 and one second wire Y32. A current sensor 32 comprises a first magnetic core 321, coils 322, and a bobbin 323. The first magnetic core 321 is connected to the bobbin 323. The bobbin 323 is disposed on a base 31. The coils 322 are winded onto the bobbin 323, and connected to a first terminal 3231 of the bobbin 323. The bobbin 323 and the first magnetic core 321 have a central hole K1 therebetween through which a part of sections of the first wires Y31 passes.

Further, a bottom of the bobbin 323 is provided with a third fixing terminal 3232 (terminal signs 3231 and 3232 are two ends of the same L-shaped terminal, hereinafter refer to the same), and the third fixing terminal 3232 is connected to the base 31.

In this embodiment, the secondary side has only one sub-winding, the sub-winding has two first wires Y31, and one second wire Y32, wherein a part of sections of one first wire Y31 passes through the current sensor 32 to detect current, and other wires are directly fixed onto the base. A sectional area of the first wire Y31 passing through the current sensor 32 is B, and a calculation formula is B=l2×t2, wherein l2 is a width of the first wire Y31, and t2 is a thickness of the first wire Y31. A sectional area of another first wire Y31 is C=l3×t3, wherein l3 is a width of the first wire Y31, and t3 is a thickness of the first wire Y31. It shall be noted that in this embodiment, the two first wires Y31 are branch wires of an outlet wire Y of the transformer, and a calculation formula of a sectional area D of the outlet wire Y is D=B+C.

The coils 322 are winded onto the bobbin 323 and connected on the first terminal 3231 of the bobbin 323, and the third fixing terminal 3232 directly positions the current sensor 32 on the base 31, such that the transformer and the current sensor 32 form an integrated magnetic element insertable onto a PCB board 34, so as to realize the electric connection with the PCB board 34.

In conclusion, the invention improves a power density of the integrated magnetic element based on a reduced volume of the magnetic element and can detect current, while satisfying the design requirement for a high power in the case of a parallel connection of a plurality of primary windings. Moreover, with the alternative arrangement for the primary and secondary windings, any of the wires of any of the windings passes through the current sensor and obtain the total current, so as to greatly reduce a volume of the current sensor, and meet the requirement of high power density, thereby improving the applicability of the integrated magnetic element.

Although the invention has been disclosed by the above embodiments, the invention is not limited thereto. Those skilled in the art shall make various variations and modifications without departing from the spirit and scope of the invention, so the protection scope of the invention shall be determined by the scope defined by the appended claims.

What is claimed is:

1. An integrated magnetic element, comprising:
an accommodating part;
a current sensor disposed on the accommodating part; and
a transformer disposed on the accommodating part, the transformer comprising a magnetic core, a first winding and a second winding, wherein the first winding comprising a plurality of first ends and second ends, the plurality of first ends formed by a plurality of wires, one first end formed by one wire, wherein the plurality of wires are connected in parallel, at least one but not all of the plurality of wires passes through the current sensor in order to detect a current value flowing through the at least one but not all of the plurality of wires, and a total current value of the first winding is obtained according to a shunt ratio.

2. The integrated magnetic element according to claim 1, wherein the first winding comprises a plurality of sub-windings connected in parallel, the second winding comprises a plurality of sub-windings connected in parallel, and the sub-windings of the first winding are interleaving arranged with the sub-windings of the second winding.

3. The integrated magnetic element according to claim 1, wherein the first winding comprises a plurality of sub-windings connected in parallel, each sub-winding comprising at least one wire.

4. The integrated magnetic element according to claim 1, wherein the first winding comprises at least one sub-winding, each sub-winding comprising a plurality of wires.

5. The integrated magnetic element according to claim 1, wherein the current sensor comprises a first magnetic core and a coil winded onto the first magnetic core, the first magnetic core having a central hole through which the at least one but not all of the wires of the first winding passes.

6. The integrated magnetic element according to claim 5, wherein the accommodating part comprises a mounting groove where the current sensor is provided.

7. The integrated magnetic element according to claim 6, wherein the accommodating part further comprises two first terminals and a side retaining wall, the mounting groove has a through-hole aligned with the central hole, both ends of the coil are electrically connected to the two first terminals correspondingly, the at least one but not all of the plurality of wires of the first winding passes through the through-hole and the central hole, and the side retaining wall is disposed between the current sensor and the transformer and fixedly connected to the transformer.

8. The integrated magnetic element according to claim 7, wherein the accommodating part further comprises a mounting hole where the wires passing through the central hole are fixed.

9. The integrated magnetic element according to claim 7, wherein the transformer further comprises a bobbin on which a second fixing terminal is provided, and the second fixing terminal connects and fixes the transformer and the accommodating part.

10. The integrated magnetic element according to claim 5, wherein the accommodating part comprises a base on which the current sensor and the transformer are disposed, and the current sensor and the transformer are integrated into one part through the base.

11. The integrated magnetic element according to claim 10, further comprising a sleeve cover disposed on the base, wherein the sleeve cover comprises a protective retaining wall, a middle part, a through-hole, at least two first terminals, and a first fixing terminal, wherein the protective retaining wall surrounds the middle part and the through-hole, the at least two first terminals are provided on an outer side of the protective retaining wall, the current sensor is placed within the sleeve cover, the central hole of the current sensor is aligned with the through-hole, both ends of the coils are electrically connected to the two first terminals correspondingly, the part of the wires of the first winding is fixed onto the base after passing through the through-hole and the central hole, and the first fixing terminal is disposed on the base to fix the sleeve cover onto the base.

12. The integrated magnetic element according to claim 1, wherein the first winding comprises N number of sub-windings connected in series or in parallel, the second winding comprises N+1 number of sub-windings connected in series or in parallel, wherein there are totally 2N+1 number of sub-windings in the transformer, wherein even-numbered layers are sub-windings of the first winding, odd-numbered layers are sub-windings of the second winding, where N is a positive integer greater than or equal to 2.

13. The integrated magnetic element according to claim 2, wherein the sub-windings are copper wire windings, copper sheet windings, or copper foil windings.

\* \* \* \* \*